(12) United States Patent
Chan et al.

(10) Patent No.: US 10,818,495 B2
(45) Date of Patent: Oct. 27, 2020

(54) SEMICONDUCTOR DEVICES AND METHODS OF MAKING THE SAME

(71) Applicant: Alpha Power Solutions Limited, Hong Kong (CN)

(72) Inventors: Wai Tien Chan, Hong Kong (CN); Wing Chong Tony Chau, Hong Kong (CN); Wing Kit Cheung, Hong Kong (CN)

(73) Assignee: Alpha Power Solutions Limited (CN)

( * ) Notice: Subject to any disclaimer, the term of this patent is extended or adjusted under 35 U.S.C. 154(b) by 0 days.

(21) Appl. No.: 16/437,897

(22) Filed: Jun. 11, 2019

(65) Prior Publication Data
US 2020/0020533 A1 Jan. 16, 2020

(30) Foreign Application Priority Data

Jul. 12, 2018 (CN) .......................... 2018 1 0762446

(51) Int. Cl.
| | |
|---|---|
| H01L 21/033 | (2006.01) |
| H01L 21/266 | (2006.01) |
| H01L 29/78 | (2006.01) |
| H01L 29/08 | (2006.01) |
| H01L 29/16 | (2006.01) |

(52) U.S. Cl.
CPC ........ H01L 21/0337 (2013.01); H01L 21/266 (2013.01); H01L 29/0847 (2013.01); H01L 29/1608 (2013.01); H01L 29/78 (2013.01)

(58) Field of Classification Search
None
See application file for complete search history.

(56) References Cited

U.S. PATENT DOCUMENTS

| | | | |
|---|---|---|---|
| 7,381,992 B2 | 6/2008 | Ryu | |
| 7,528,040 B2 | 5/2009 | Das et al. | |
| 8,859,366 B2 | 10/2014 | Das et al. | |
| 2005/0280004 A1 | 12/2005 | Das et al. | |
| 2007/0264785 A1* | 11/2007 | Choi | ................... H01L 29/1095 438/297 |

(Continued)

FOREIGN PATENT DOCUMENTS

| | | |
|---|---|---|
| CN | 1977386 | 6/2007 |
| CN | 105103297 | 11/2015 |

(Continued)

*Primary Examiner* — Khaja Ahmad
(74) *Attorney, Agent, or Firm* — Robert D. Atkins; Patent Law Group: Atkins and Associates, P.C.

(57) ABSTRACT

An exemplary method of making a semiconductor device includes providing a semiconductor layer of a first conductivity type, providing a first hard mask on a surface of the semiconductor layer, patterning the first hard mask to obtain a patterned first hard mask to obtain an exposed surface of the semiconductor layer, forming a body region in the semiconductor layer by using the patterned first hard mask as mask, the body region being of a second conductivity type different from the first conductivity type, providing a second hard mask on the patterned first hard mask and the exposed surface of the semiconductor layer, patterning the second hard mask to obtain a patterned second hard mask, and forming a contact region and a sinker region by using the patterned first hard mask and the patterned second hard mask as mask.

15 Claims, 11 Drawing Sheets

(56) References Cited

U.S. PATENT DOCUMENTS

| | | | |
|---|---|---|---|
| 2009/0206395 A1* | 8/2009 | Hshieh | H01L 29/0878 257/328 |
| 2014/0183553 A1 | 7/2014 | Zhang et al. | |
| 2015/0041886 A1 | 2/2015 | Pala et al. | |
| 2015/0380494 A1* | 12/2015 | Furuhashi | H01L 29/7802 257/77 |
| 2017/0263757 A1* | 9/2017 | Saikaku | H01L 29/0878 |
| 2017/0271442 A1* | 9/2017 | Uehara | H01L 29/7802 |
| 2019/0074372 A1* | 3/2019 | Kobayashi | H01L 21/26513 |

FOREIGN PATENT DOCUMENTS

| | | |
|---|---|---|
| CN | 105185833 | 12/2015 |
| CN | 105431948 | 3/2016 |
| KR | 20040001939 | 1/2004 |

\* cited by examiner

SEMICONDUCTOR DEVICES AND METHODS OF MAKING THE SAME

CLAIM OF FOREIGN PRIORITY

The present application claims the benefit of Chinese Patent Application No. 201810762446.6, filed on Jul. 12, 2018, which application is incorporated herein in its entirety.

FIELD OF THE INVENTION

The present invention relates generally to semiconductor field, and more particularly to semiconductor devices and methods of making the same.

BACKGROUND OF THE INVENTION

Conventionally, when making a semiconductor device, such as a silicon carbide (SiC) Metal-Oxide-Semiconductor Field-Effect Transistor (MOSFET), multiple masks are required. For example, a first mask is needed for ion implantation to form a p-type body region, followed by a second mask for ion implantation to form a p+ sinker region and a third mask for forming a n+ source region.

New process or methods that assist in advancing technological needs and industrial applications in semiconductor field are desirable.

SUMMARY OF THE INVENTION

One exemplary embodiment provides a method of making a semiconductor device. The method includes providing a semiconductor layer of a first conductivity type, providing a first hard mask on a surface of the semiconductor layer, patterning the first hard mask to obtain a patterned first hard mask such that a portion of the surface is exposed to obtain an exposed surface of the semiconductor layer, forming a body region in the semiconductor layer by using the patterned first hard mask as mask, the body region being of a second conductivity type different from the first conductivity type, providing a second hard mask on the patterned first hard mask and the exposed surface of the semiconductor layer, patterning the second hard mask to obtain a patterned second hard mask, and forming a contact region and a sinker region by using the patterned first hard mask and the patterned second hard mask as mask, the contact region and the sinker region being of the second conductivity type.

Other exemplary embodiments are discussed herein.

BRIEF DESCRIPTION OF THE DRAWINGS

Embodiments of the present invention will now be described, by way of example, with reference to the accompanying drawings in which like reference numbers indicate the same or similar elements, and in which.

DETAILED DESCRIPTION OF THE DRAWINGS

Example embodiments relate to semiconductor devices and methods thereof with improved device performance and manufacturing process.

One or more embodiments recognize one or more technical problems existing for conventional devices and methods. For example, conventional methods for making semiconductor devices, such as a MOSFET, are complicated. Multiple masks are required, and parameters of each mask must be precisely designed. As such, device performance is susceptible to design of masks and parameter shift of manufacturing process. Another issue for conventional methods is that precise alignment between gate region and source region is hardly achieved. The asymmetric channels on both sides of gate region often result in unbalance in current for MOSFET, thereby degrading the device performance severely. The conventional methods are more problematic for SiC MOSFETs. This is because the distance between adjacent MOSFET units are generally in a range from 7 micrometer (μm) to 12 μm for conventional devices. This distance is difficult to be reduced for conventional devices to improve device performance.

One or more embodiments as described herein solve one or more of above technical problems by providing novel manufacturing methods and structural design for semiconductor devices, such as MOSFETs. The novel manufacturing methods, for example, simplify the manufacturing process and achieves self-alignment of source region to channel, thereby improving device performance and reducing cost of device fabrication.

In one or more embodiments, a two-step hard mask process is introduced to enable contact region and sinker region in a single ion implantation or a chain of ion implantation. The mask for forming contact region and sinker region is further used to form source region, which is advantageous over convention methods where another separate mask is required to form source region.

In one or more embodiments, parameters in relation to contact region and sinker region, such as relative position and junction depths, may be flexibly changed by changing implantation energy of ions, thickness of mask, etc. This is advantageous in manufacture process.

In one or more embodiments, due to the self-alignment as achieved, current asymmetry induced by misalignment in conventional devices is avoided or mitigated. The better alignment also allows reduced distance between adjacent units, which is cost-effective and advantageous in device performance, such as improving switching speed.

Figure 1A:
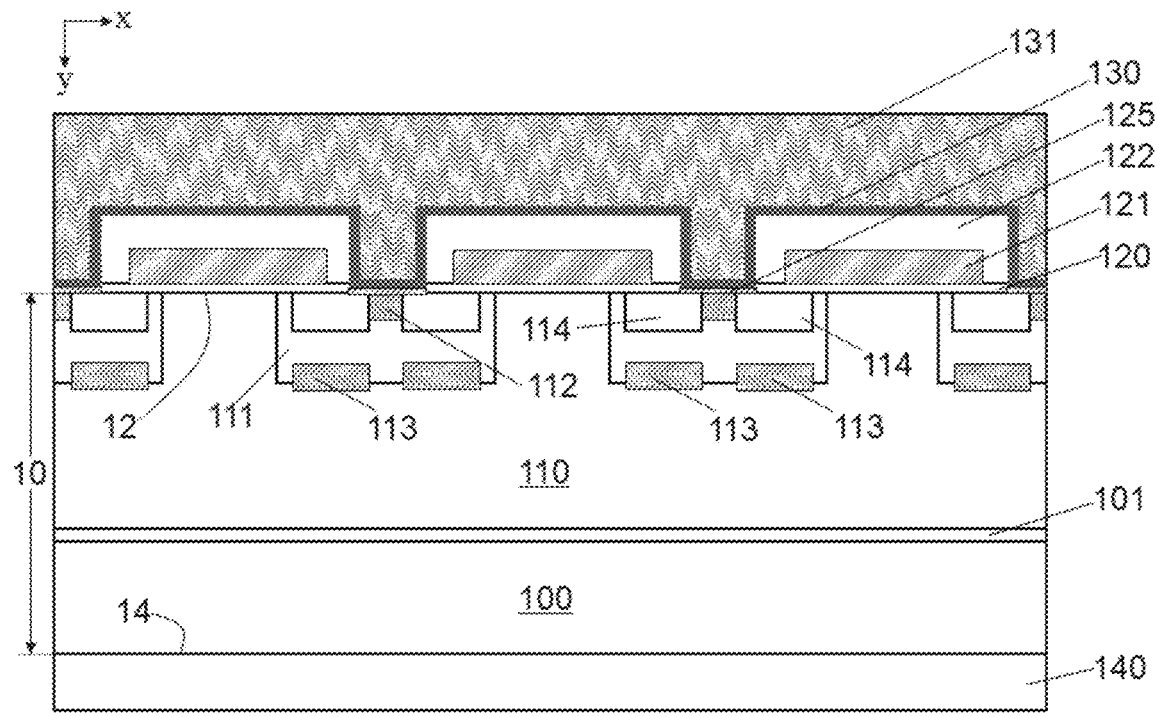
FIG. 1A illustrates structure of a semiconductor device in accordance with an embodiment.

In accordance with one aspect of embodiments, FIG. 1A illustrates structure of semiconductor devices in accordance with an embodiment. The structure is a cross-sectional illustration. The semiconductor devices as shown are illustrated as MOSFETs, such as SiC MOSFETs. In practice, a chip may include multiple MOSFETs or MOSFET units that are uniformly and periodically distributed. For clarity, FIG. 1A shows two complete MOSFET units (in the middle) and two partial MOSFET units (at edges).

The semiconductor device includes a semiconductor layer 10 having a first surface or top surface 12 and a second surface or bottom surface 14. The semiconductor layer 10 includes a substrate 100, a first epitaxial layer 101 formed or disposed on the substrate 100, and a second epitaxial layer 110 formed or disposed on the first epitaxial layer 101.

The semiconductor layer 10 is of a first conductivity type (such as n-type or n-doped) and may include SiC materials. The substrate 100 may be n+ doped 4H—SiC, 3C—SiC, 6H—SiC, or the like. The first epitaxial layer 101 may be a n-type thin buffer layer. The second epitaxial layer 110 may be a n-doped drift layer. The doping concentration or impurity concentration decreases from the substrate 100 towards the second epitaxial layer 110.

As illustrated, a body region 111 is disposed in the second epitaxial layer 110 and extends from the top surface 12 towards the substrate 100 (i.e., along y axis). The body region 111 is of a second conductivity type, such as p-type or p-doped, and may function as a well region.

The semiconductor device further includes a contact region 112 and a sinker region 113. The contact region 112, being of second conductivity type (such as p-type), is disposed in the body region 111 and extends from the top surface 12 towards the substrate 100. The sinker region 113 is of the second conductivity type and is embedded in the second epitaxial layer 110. The contact region 112 and the sinker region 113 may be formed by ion implantation with a same mask. Both the contact region 112 and the sinker region 113 have higher doping concentration than that of the body region 111.

In the present embodiment, the sinker region 113 is physically separated from the contact region 112. The sinker region 113 overlaps a bottom edge or boundary of the body region 111. More specifically, the sinker region 113 overlaps or contacts a junction formed between the body region 111 and the second epitaxial layer 110. The junction is where the body region 111 meets the second epitaxial layer 110 to form a PN junction at the bottom of the body region 111. In some other embodiments, the sinker region 113 is physically connected to the contact region 112. In yet other embodiments, the sinker region 113 is within the body region 111 and does not contact the edge of the body region 111. The sinker region 113 is advantageous. For example, presence of the sinker region 113 reduces bulk resistance of the device and improves device performance, such as avalanche breakdown, switching speed, etc., and is favorable for high speed device applications.

The semiconductor device further includes two source regions 114. The source regions 114 are of n-type (or n-doped). The source regions 114 extend from the surface 12 towards the substrate 100 and are disposed in the body region 111. The two source regions 114 are so configured that the contact region 112 is placed between the two source regions 114 and contacts the two source regions 114.

As shown in FIG. 1A, the semiconductor device includes a gate oxide layer 120, a patterned doped polysilicon layer 121, and interlayer dielectric 122. The gate oxide layer 120 is disposed on the second epitaxial layer 110. The patterned doped polysilicon layer 121 is formed on the gate oxide layer 120 and is patterned to form, together with the gate oxide layer 120, a gate or gate region of the semiconductor device. The interlayer dielectric 122 is formed onto and covers the patterned doped polysilicon layer 121 and contacts the gate oxide layer 120, and is used to isolate the gate from surrounding metal contact. Further, silicide metal layer 125, barrier metal layer 130, and top metal layer 130 form a source contact. A back metal layer 140 is disposed on the bottom surface 14 of the semiconductor layer 10 to form a drain contact.

Figure 1B:
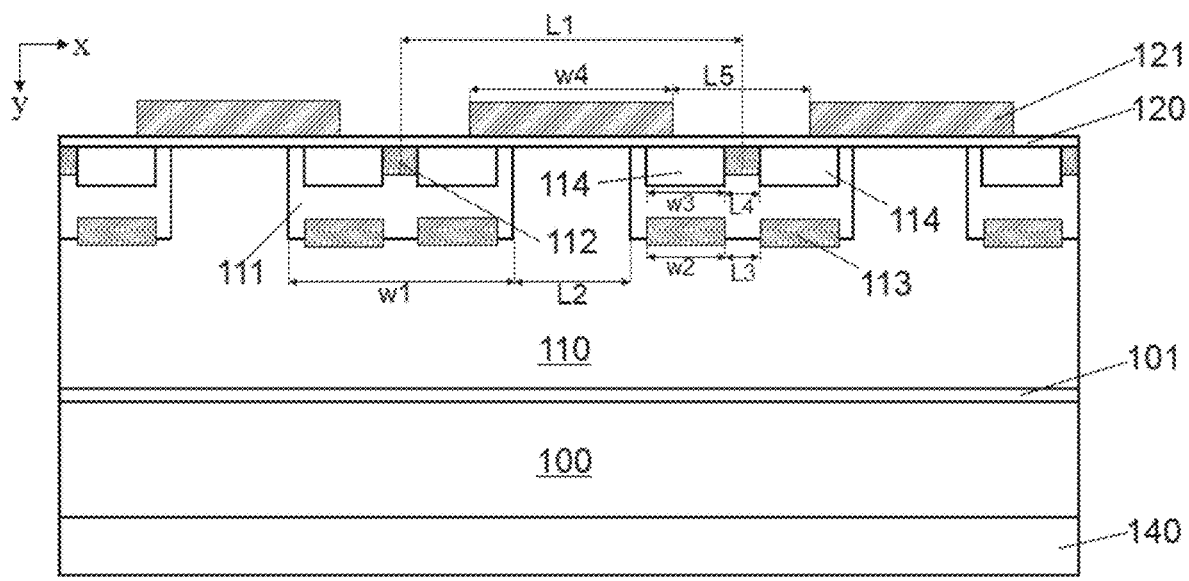
FIG. 1B illustrates some dimensions of the semiconductor device of FIG. 1A in accordance with an embodiment.

With reference to FIG. 1B, the distance (represented by L1) along x axis between adjacent MOSFETs may be from 5 μm to 7 μm, such as 6 μm. The width (represented by w1) of the body region 111 along x axis may be from 4.3 μm to 4.9 μm, such as 4.6 μm. In the second epitaxial layer 110, the distance (represented by L2) along x axis between two adjacent body region 111 may be from 1.1 μm to 1.7 μm, such as 1.4 μm. The width (represented by w2) of the sinker region 113 along x axis may be from 1.3 μm to 1.5 μm, such as 1.4 μm. The width (represented by w3) of the source region 114 along x axis may be from 1.3 μm to 1.5 μm, such as 1.4 μm. In the body region 111, the distance (represented by L3) along x axis between two adjacent sinker region 113 associated with a same body region may be from 0.9 μm to 1.1 μm, such as 1.0 μm. The distance (represented by L4) along x axis between two adjacent source region 114 in a same body region may be from 0.9 μm to 1.1 μm, such as 1.0 μm. The width (represented by w4) of each portion of patterned doped polysilicon layer 121 may be from 2.9 μm to 3.5 μm, such as 3.2 μm. The distance (represented by L5) along x axis between two adjacent portions of patterned doped polysilicon layer 121 may be from 2.5 μm to 3.1 μm, such as 2.8 μm.

In accordance with another aspect of embodiments, FIGS. 2A-10 illustrates methods of making semiconductor devices. For example, the methods as illustrated may be implemented to make the semiconductor device of FIGS. 1A and 1B.

Figure 2A:
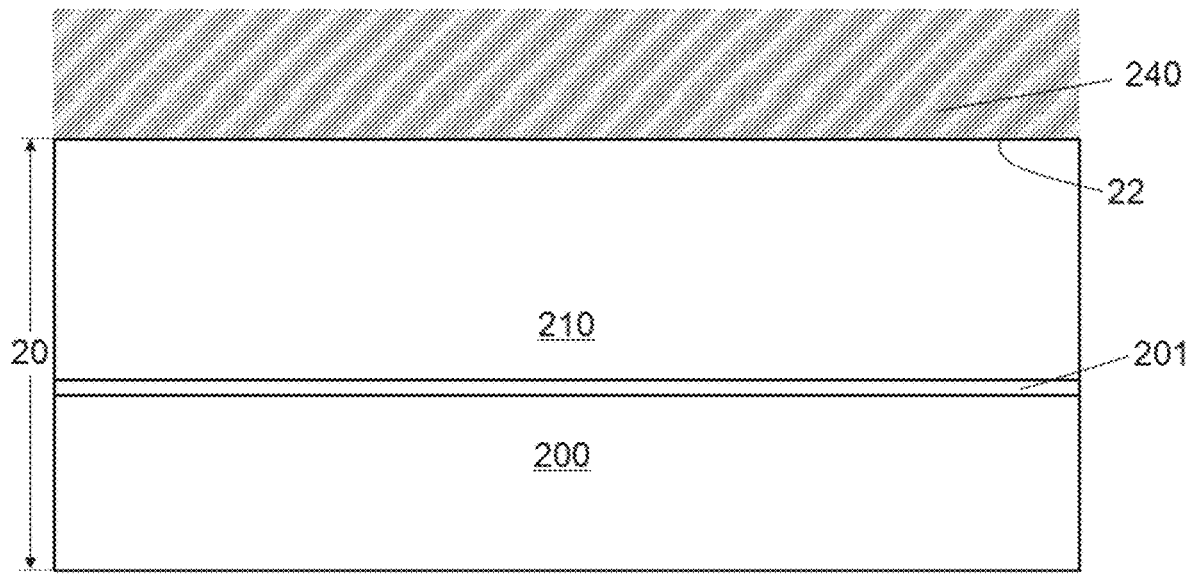
FIG. 2A illustrates a method of forming a first hard mask in accordance with an embodiment.

As illustrated in FIG. 2A, a semiconductor layer 20 of a first conductivity type is provided. The semiconductor layer 20 may include 4H—SiC, 3C—SiC, or 6H—SiC materials. In the present embodiment, the semiconductor layer 20 includes n-type 4H—SiC material. The semiconductor layer 20 includes a substrate 200, a first epitaxial layer 201, and a second epitaxial layer 210. The substrate 200 has a thickness of around 350 μm with a resistivity from 0.02 Ω·cm to 0.03 Ω·cm. The first epitaxial layer 201 is formed on the substrate 200 and may function as a buffer layer. The first epitaxial layer 201 is around 0.5 μm in thickness with a doping concentration from 1E18 cm$^{-3}$ (i.e., $1\times10^{18}$ cm$^{-3}$) to 2E18 cm$^{-3}$. The second epitaxial layer 210 is formed on the first epitaxial layer 201 as a top epitaxial layer or drift layer. The second epitaxial layer 210 has a thickness from 5 µm to 30 µm with a doping concentration from 1E15 cm$^{-3}$ to 2E16 cm$^{-3}$.

A first hard mask 240 is provided on a top surface or surface 22 of the semiconductor layer 20. In the present embodiment, the surface 22 is also the top surface or surface of the second epitaxial layer 210. The first hard mask 240 may be an oxide layer (or a first oxide layer) formed of proper oxide materials, such as silane (SiH4)-based oxide, tetraethylorthosilicate (TEOS)-based oxide, etc. The first hard mask 240 may be formed through proper semiconductor process including, but is not limited to, Low Pressure Chemical Vapor Deposition (LPCVD), Plasma Enhanced Chemical Vapor Deposition (PECVD), High Density Plasma Chemical Vapor Deposition (HDPCVD). In the present embodiment, plasma-enhanced tetraethylorthosilicate (PETEOS) is deposited on the second epitaxial layer 210 to form the first hard mask 240. The first hard mask 240 may have a thickness from 3 µm to 6 µm.

Figure 2B:
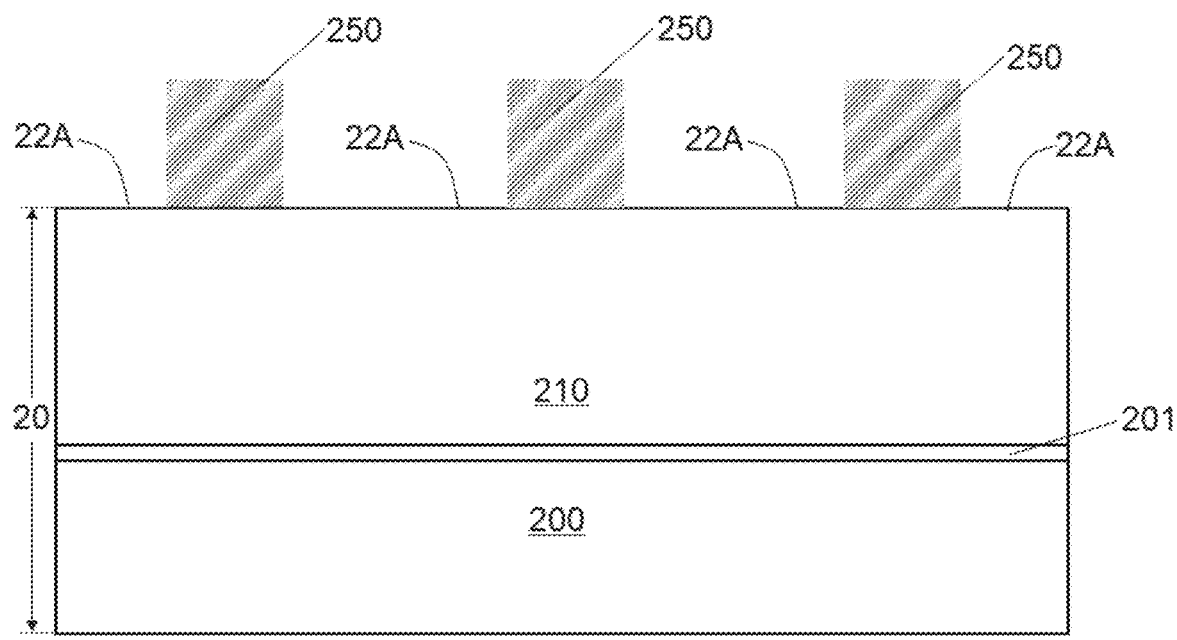
FIG. 2B illustrates a method of patterning the first hard mask of FIG. 2A.

With reference to FIG. 2B, the first hard mask 240 of FIG. 2A is patterned to obtain a patterned first hard mask 250. As such, a portion of the surface 22 is exposed to form or obtain an exposed surface 22A of the semiconductor layer 20. Other portions of the surface 22 is covered by the patterned first hard mask 250. In the present embodiment, the patterning process may be conducted by photolithographic process followed by dry etching for the PETEOS.

Figure 2C:
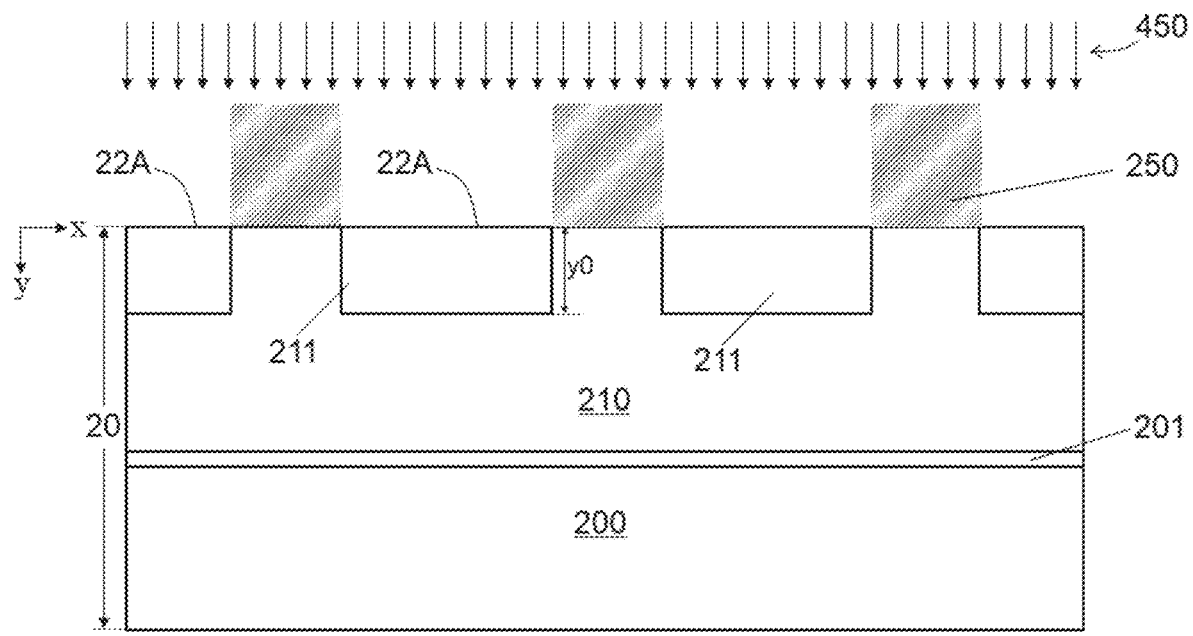
FIG. 2C illustrates a method of forming body region in accordance with an embodiment.

In FIG. 2C, a body region 211 is formed in the semiconductor layer 20 (more specifically, in the second epitaxial layer 210) by using the patterned first hard mask 250 as mask. The exposed surface 22A provides a window for ion implantation (or first ion implantation). In the present embodiment, at a temperature ranging from 400° C. to 600° C., aluminum (Al) ions 450 are employed for ion implantation. Al ions that impinge or hit onto the patterned first hard mask 250 are blocked and cannot reach the semiconductor layer 20, while Al ions that impinge onto the exposed surface 22A are injected into the semiconductor layer 20 to form the n-doped body region 211 with a junction depth (represented by y0) from around 0.9 µm to 1.5 µm.

Implantation of Al ions 450 may include a series of or a chain of implantations, such as 3 to 6 times of implantation (i.e., implantation for three times, four times, five times, or six times). Each implantation may have same or different energies, such as energies from 50 keV to 950 keV, and same or different dose, such as dose from 1E12 cm$^2$ to 1E13 cm$^2$ in achieving expected doping profile or distribution.

Figure 2D:
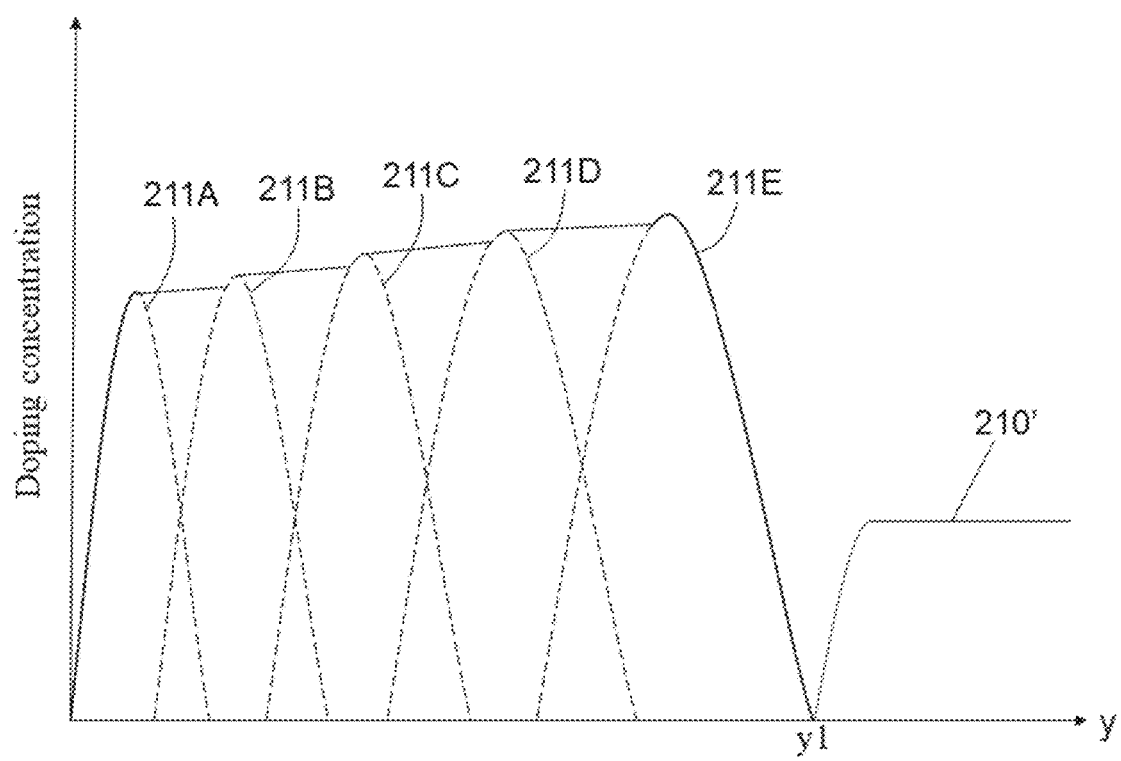
FIG. 2D illustrates doping profiles of the body region of FIG. 2C in accordance with an embodiment.

FIG. 2D illustrates doping profile of body region with five ion implantations. The doping profiles in the body region produced by the five ion implantation steps are represented by 211A, 211B, 211C, 211D, and 211E respectively. The doping profile 210' is for the second epitaxial layer 210. As illustrated, the doping profile 211E corresponds to ion implantation with highest energy and thereby largest implantation depth into the second epitaxial layer 210. The point y1 is where the PN junction forms between the body region 211 and the second epitaxial layer 210, and corresponds to the junction depth y0 in FIG. 2C. The overall doping profile of the body region 211 is superposition of the five doping profiles 211A-211E. According to practical needs, along the direction towards the second epitaxial layer 210 (i.e., along y axis), the doping concentration may vary linearly or nonlinearly over position. In some embodiments, to achieve a retrograde doping profile, the shallow implantation (e.g. implantation corresponding to the doping profile 211A) has lowest dose, while the deepest implantation (e.g., implantation corresponding to the doping profile 211E) has highest dose.

Figure 3:
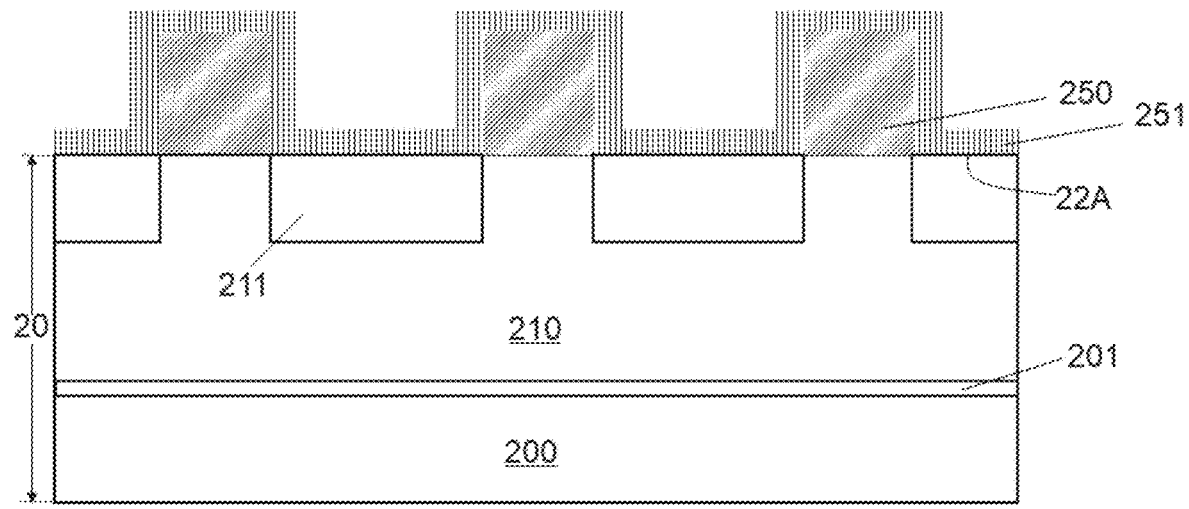
FIG. 3 illustrates a method of forming a second hard mask in accordance with an embodiment.

With reference to FIG. 3, a second hard mask 251 is provided on the patterned first hard mask 250 and the exposed surface 22A of the semiconductor layer 20. The second hard mask 251 may be a conformal dielectric film such that the second hard mask 251 substantially has a uniform thickness. For example, the thickness of the second hard mask 251 on the top and the sidewall of the patterned first hard mask 250 are same or similar. The conformal dielectric film may be an oxide film or oxide layer (or second oxide layer). The oxide layer may include SiH4-based oxide, TEOS-based oxide, or the like. The oxide layer may be formed through proper process including, but is not limited to, LPCVD, PECVD, and HDPCVD. In the present embodiment, the oxide layer is formed of low pressure tetraethylorthosilicate (LPTEOS) materials by LPCVD process and has a thickness from 0.6 µm to 1.2 µm.

Figure 4A:
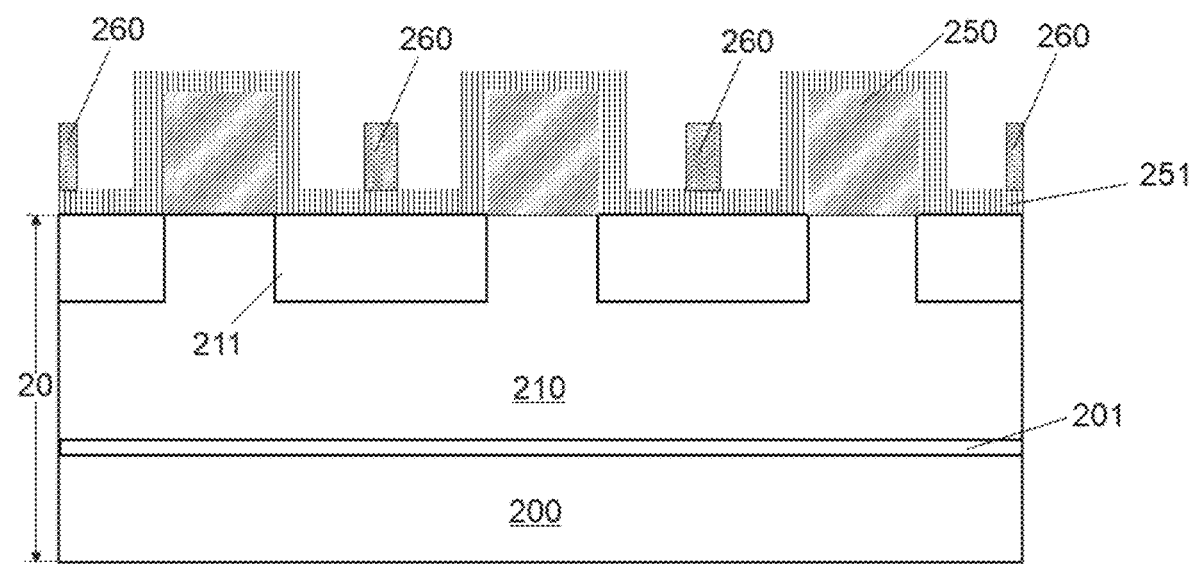
FIG. 4A illustrates a method of patterning photoresist in accordance with an embodiment.
Figure 4B:
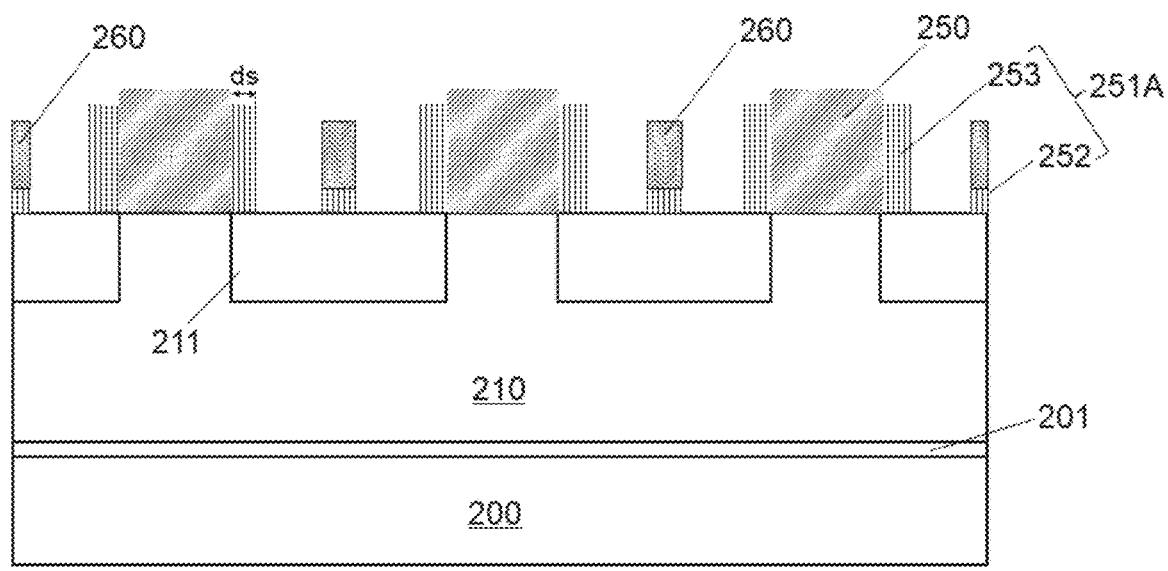
FIG. 4B illustrates a method of patterning the second hard mask in accordance with an embodiment.
Figure 4C:
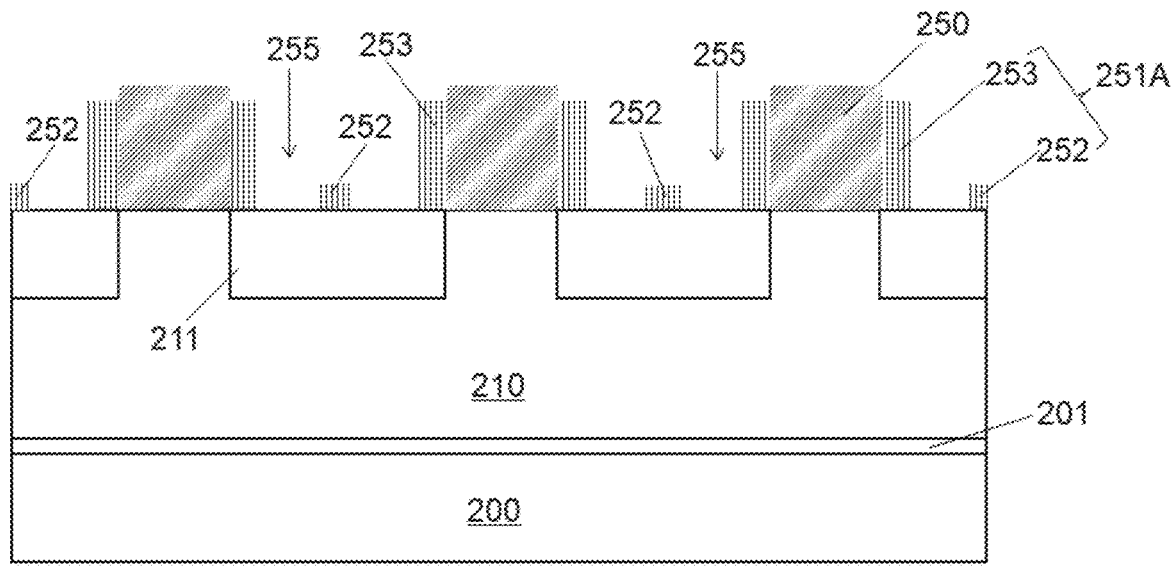
FIG. 4C illustrates a method of removing the photoresist of FIG. 4B.

In FIGS. 4A-4C, the second hard mask 251 is patterned to obtain a patterned second hard mask 251A. The patterned second hard mask 251A includes a first portion 252 that does not contact the sidewall of the patterned first hard mask 250 and a second portion 253 that contacts or covers at least partly the sidewall of the patterned first hard mask 250.

In FIG. 4A, photoresist is coated on the second hard mask 251, followed by a photolithographic process for photoresist removal such that photoresist 260 is left. In FIG. 4B, with the photoresist 260 as mask, reactive ion etching (RIE) process is employed to pattern the second hard mask 251 to obtain the patterned second hard mask 251A. Only portions of the second hard mask that are covered by the photoresist 260 and part of portions that contact sidewall of the patterned first hard mask 250 are retained. The proportion or ratio of the chemical etch vs bombardment may be adjusted by RIE recipe. As such, the sidewall thickness (represented by ds) of the second portion 253 is adjustable, and portions of the second hard mask 251 on the surface 22 without coverage by the photoresist 260 is removed. The sidewall thickness is one factor in determining channel length of the semiconductor device. The channel length may be adjusted by adjusting the sidewall thickness. The photoresist 260 is then removed and the patterned second hard mask 251A is achieved as illustrated in FIG. 4C. The exposed portion of the surface of the body region 211 provides windows 255 for impurity doping as detailed later.

Figure 5A:
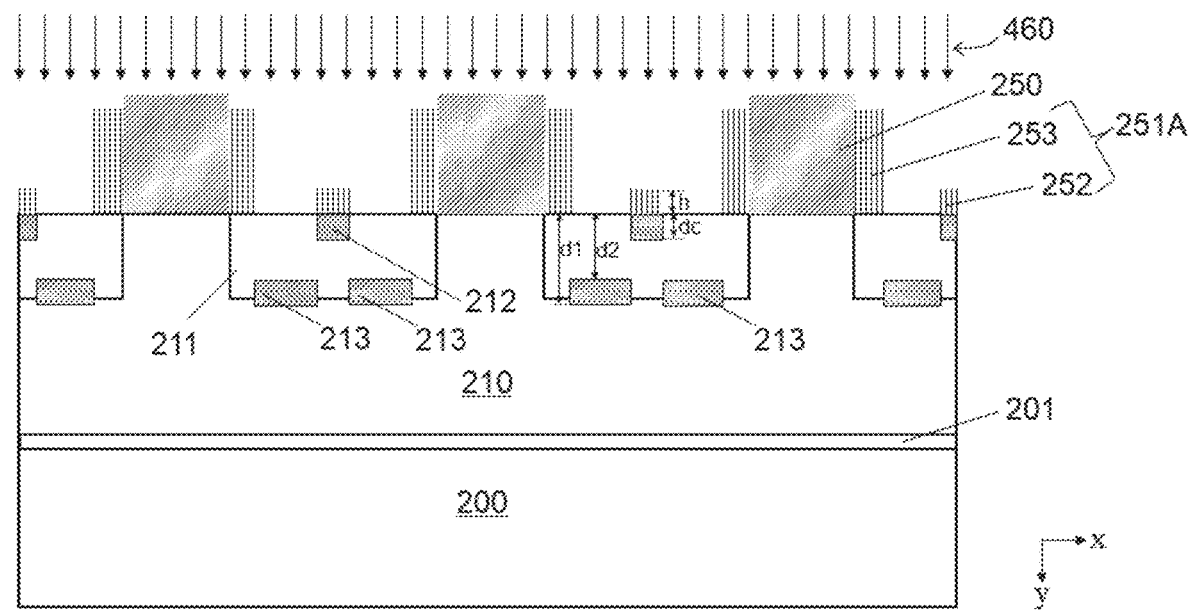
FIG. 5A illustrates a method of forming a contact region and a sinker region in accordance with an embodiment.

With reference to FIG. 5A, contact region 212 and sinker region 213 are formed by conducting a second ion implantation using the patterned first hard mask 250 and the patterned second hard mask 251A as mask. In the present embodiment, Al ions 460 are employed for ion implantation such that the contact region 212 and the sinker region 213 are formed simultaneously under a same mask or same masks. The thickness or height (represented by h) of the first portion 252 along y axis is from 0.9 µm to 1.2 µm. The energy of Al ions 460 is from 700 eV to 1,000 eV, and the dose is from 1E14 cm$^2$ to 8E14 cm$^2$. The energy of Al ions 460 is so configured that Al ions can penetrate through the first portion 252 and into the body region 211 to form the contact region 212. Al ions 460 that impinge onto the exposed portion of the body region 211 go a longer way into the second epitaxial layer 210 to form the sinker region 213. That is, single implantation process can form two types of regions—contact region and sinker region. On the other hand, Al ions that impinge onto the patterned first hard mask 250 and the second portion 253 are prevented from reaching surface of the second epitaxial layer 210 and thus cannot dope the second epitaxial layer 210.

The profiles of the contact region 212 and the sinker region 213 may be adjusted by adjusting one or both of energy of Al ions 460 and thickness of the first portion 252 of the patterned second hard mask 251A. The profiles, for example, may be the relative position between the contact region 212 and the sinker region 213, the junction depths of the contact region 212 and the sinker region 213. In the present embodiment, the sinker region 213 overlaps a junction formed between the body region 211 and the semiconductor layer 20 at the bottom of the body region 211. The contact region 212 is physically separated from the sinker region 213.

As illustrated in FIG. 5A, the junction depth (represented by dc) of the contact region 212 along y axis is from 0.2 μm to 0.5 μm. Along y axis, the central or middle point of the sinker region 213 is represented by (d1+d2)/2 and is from 1 μm to 1.6 μm relative to the top surface of the second epitaxial layer 210.

Figure 5B:
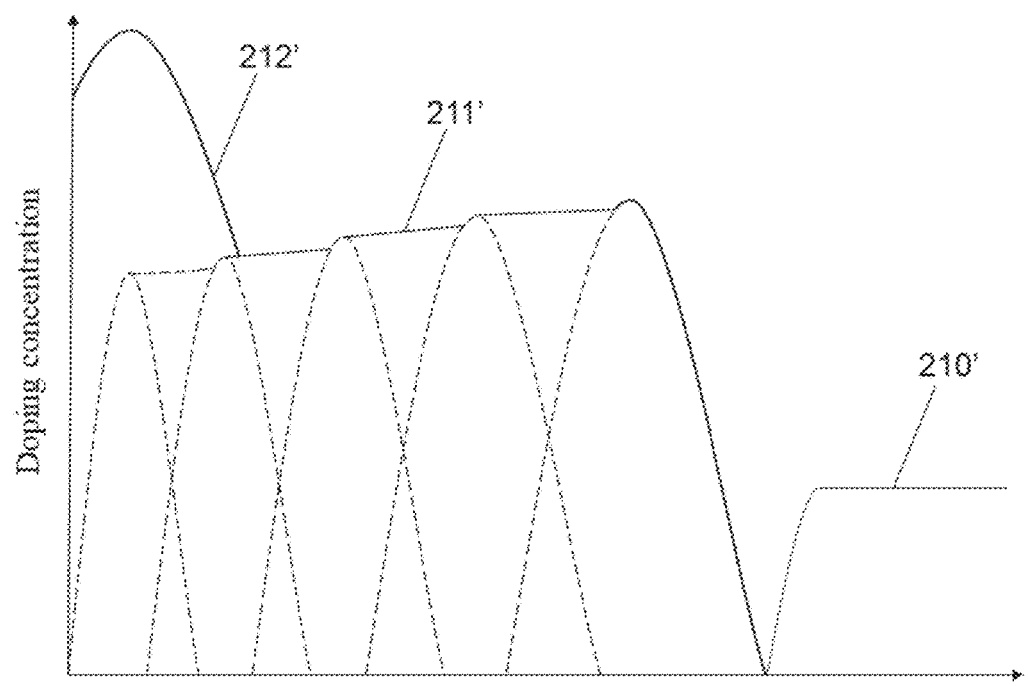
FIG. 5B illustrates doping profiles of contact region, body region, and second epitaxial layer of FIG. 5A in accordance with an embodiment.
Figure 5C:
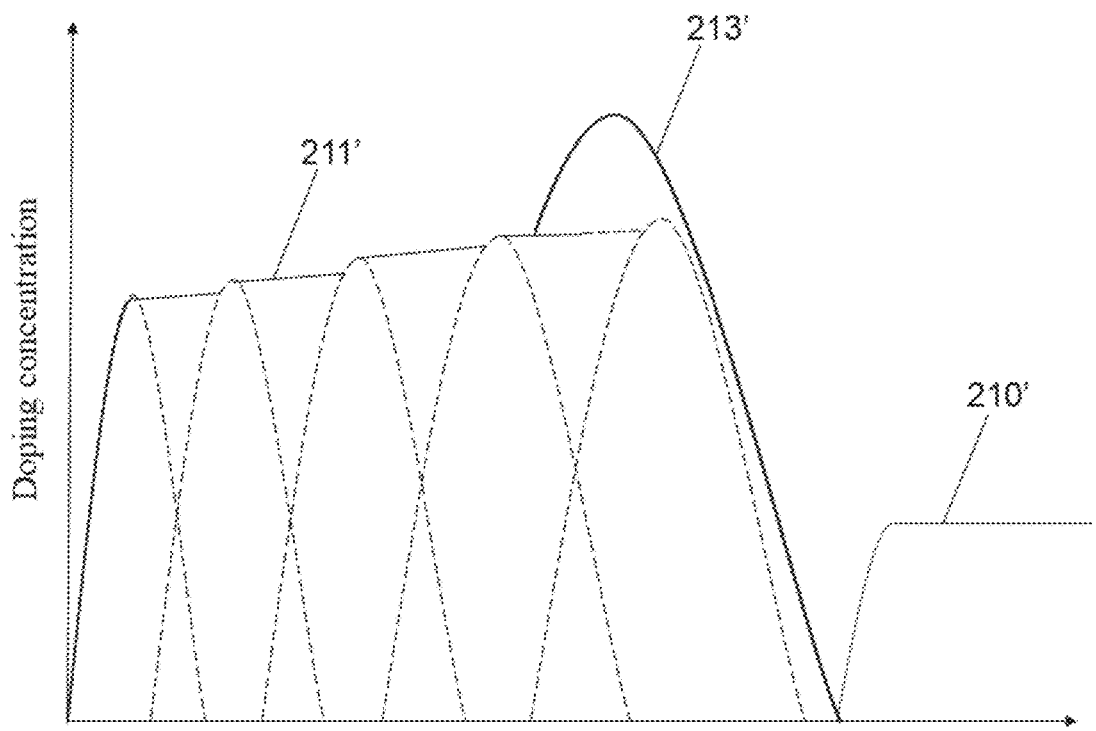
FIG. 5C illustrates doping profiles of body region, sinker region, and second epitaxial layer of FIG. 5A in accordance with an embodiment.

The doping profiles 211', 212', 213', and 210' of the body region 211, the contact region 212, the sinker region 213, and the second epitaxial layer 210 respectively are illustrated in FIGS. 5B and 5C.

Figure 6:
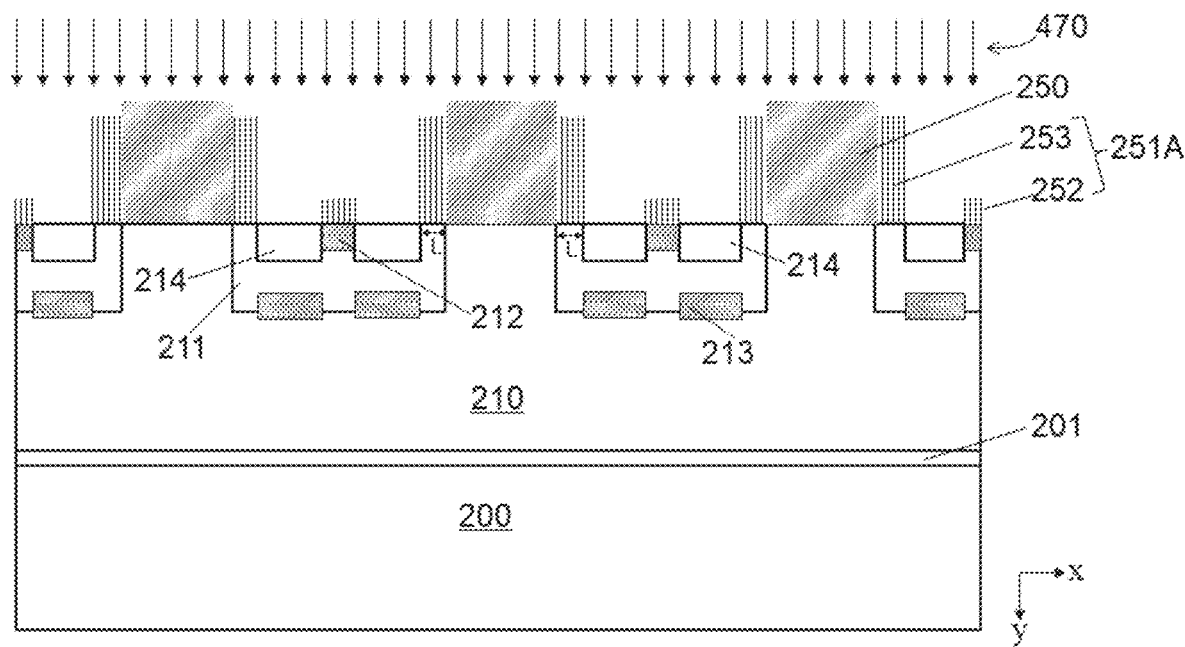
FIG. 6 illustrates a method of forming source region in accordance with an embodiment.

With reference to FIG. 6, source regions 214 of the first conductivity type is formed by using the patterned first hard mask 250 and the patterned second hard mask 251A as mask. Ions, such as nitrogen ions 470 are injected into the body region 211 to form two source regions 214 in the body region 211. In the present embodiment, the doping concentration of the source regions 214 is from $2E19$ $cm^{-3}$ to $1E20$ $cm^{-3}$. The lateral distance (represented by L, which is also the channel length) along x axis between the source region 214 and the adjacent edge of the body region 211 depends on the lateral dimension (which is also L) of the second portion 253 of the patterned second hard mask 251A. As such, the MOSFET channels are formed by this self-alignment of source region, and unbalancing of adjacent MOSFET channels is avoided, thereby device performance, such as current symmetry, can be improved.

Further, in accordance with the embodiments, employment of two hard masks can form body region, contact region, sinker region, and source region. Parameters of the contact region and the sinker region, such as junction depth, relative position, etc. may be adjusted by adjusting parameters, such as thickness of hard mask, energy of ion implantation, etc. The manufacturing process is simple and flexible. Potential parameter shift during manufacturing process is mitigated, reduced, or even avoided.

Figure 7:
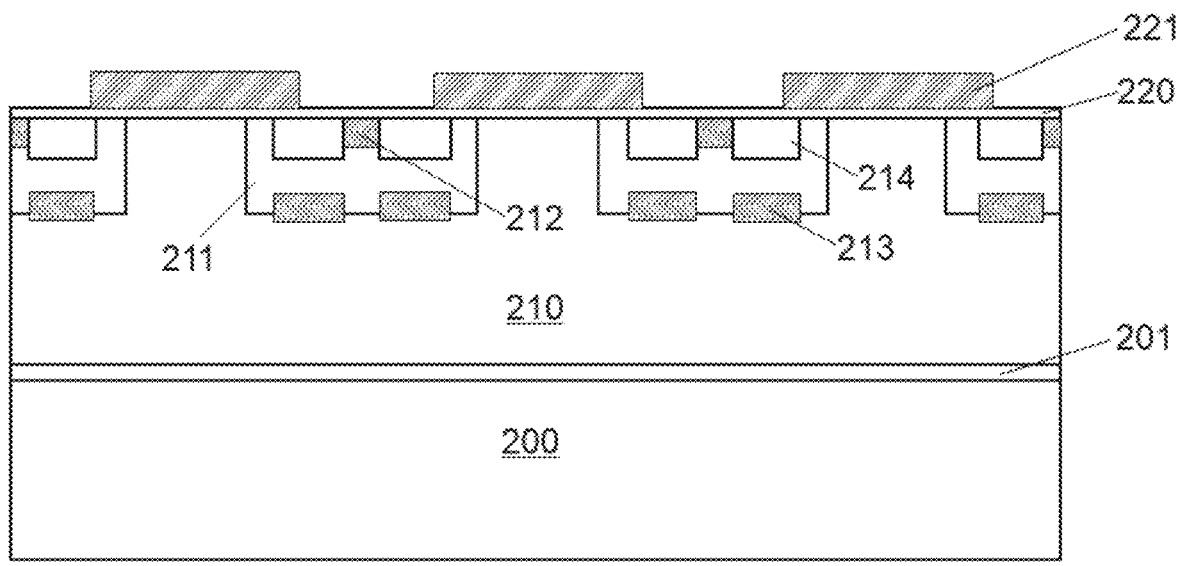
FIG. 7 illustrates a method of forming a gate region in accordance with an embodiment.

In FIG. 7, the patterned first and second hard masks 250 and 251A are removed by proper process, such as wet oxide clean. A gate oxide layer 220 is formed on the top surface of the second epitaxial layer 210, which may be implemented by one or more steps of thermal oxidation or deposition. For example, the gate oxide layer 220 with a thickness from 20 nm to 80 nm may be grown by thermal oxidation, followed by post oxidation anneal with nitrous oxide ($N_2O$) or nitric oxide (NO) to passivate defects at the semiconductor/oxide interface.

A doped polysilicon layer is formed on the gate oxide layer 220. For example, an in-situ doped polysilicon layer is deposited onto the gate oxide layer 220 by chemical vapor deposition (CVD) with thickness from 300 nm to 700 nm. The doped polysilicon layer is patterned with photolithographic and RIE processes to obtain a patterned doped polysilicon layer 221, thereby defining a gate region for the MOSFET.

Figure 8:
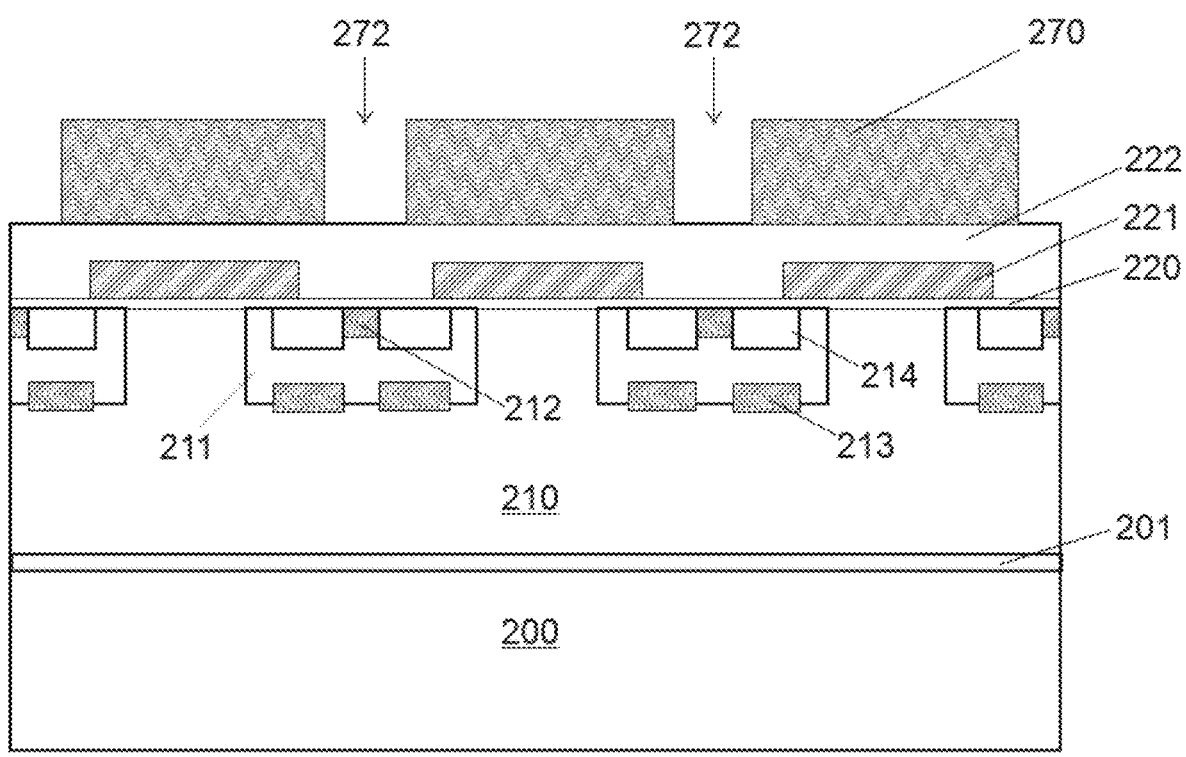
FIG. 8 illustrates a method of forming interlayer dielectric in accordance with an embodiment.

In FIG. 8, interlayer dielectric 222 is formed. For example, a layer of PETEOS is deposited and then densified to form the interlayer dielectric 222 with thickness from 1.2 μm to 2.0 μm. The densification may be a thermal anneal process under temperature from 800° C. to 900° C. A photoresist layer 270 is then coated onto the interlayer dielectric 222. A photolithographic process is conducted on the photoresist layer 270 to expose windows 272 for metal contact formation.

Figure 9:
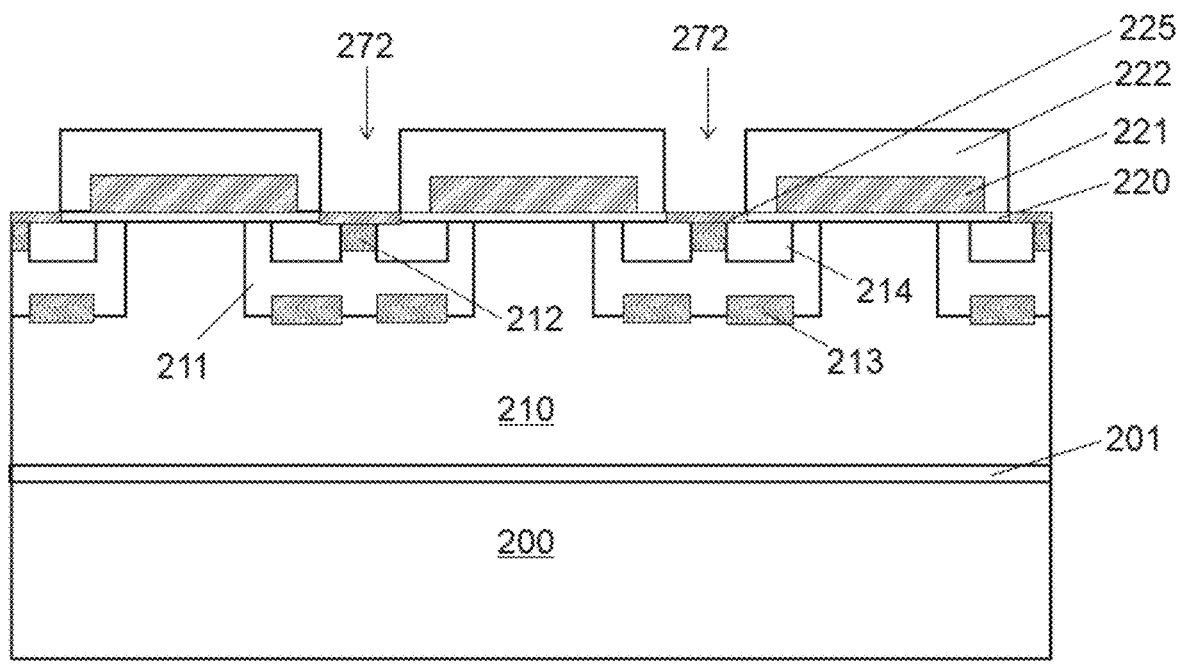
FIG. 9 illustrates a method of forming metal contact in accordance with an embodiment.

In FIG. 9, the exposed portion of the interlayer dielectric 222 and the underlying gate oxide layer 220 are removed with RIE process. Through the windows 272, contact metal (such as titanium or nickel) are filled and contacts the contact region 212 and part of the source region 214. By way of example, a contact metal with thickness of 50 nm to 300 nm is formed by sputtering nickel, followed by rapid thermal annealing at temperature from 500° C. to 900° C. to form nickel silicide metal layer 225. Nickle that does not participate in formation of nickel silicide is removed by chemical etching.

Figure 10:
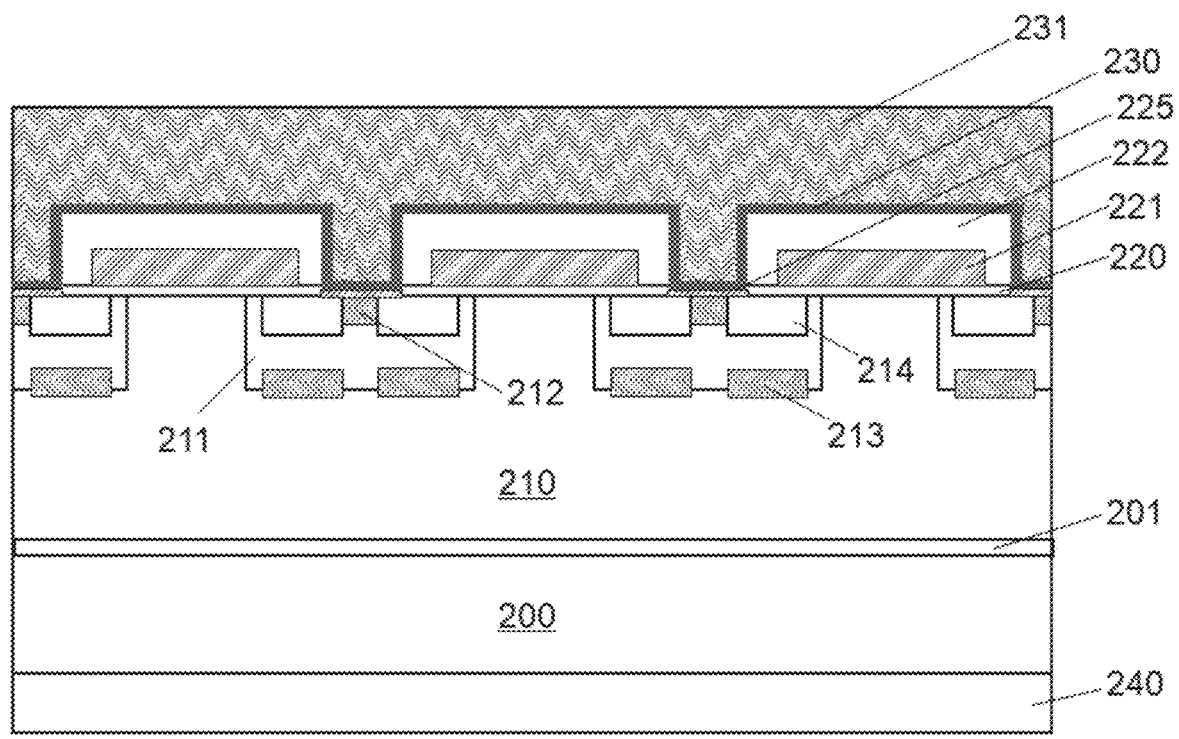
FIG. 10 illustrates a method of forming top metal and bottom metal in accordance with an embodiment.

In FIG. 10, a barrier metal layer 230 is formed by depositing titanium/titanium nitride (Ti/TiN). A top metal layer 231 of aluminum is formed on the barrier metal layer 230 and has a thickness from 2 μm to 5 μm. The back side of substrate 200 is then ground to a thickness of 150 μm to 300 μm. A back metal layer 240 is deposited to the back side of the substrate 200 to form the drain contact.

Figure 11A:
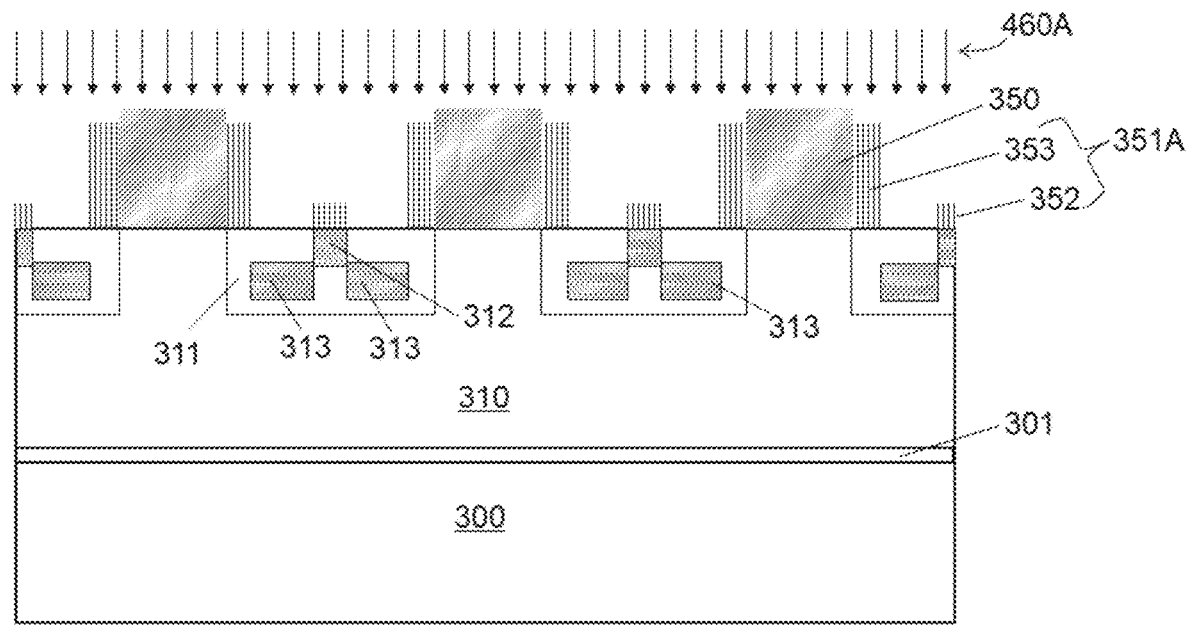
FIG. 11A illustrates another method of forming a contact region and a sinker region in accordance with an embodiment.

The above embodiments are described for illustrative purpose, and should not be read as limiting. For example, in FIG. 5A, the contact region 212 and the sinker region 213 are physically disconnected. In some other embodiments, for example, as illustrated in FIG. 11A, the contact region 312 is physically connected with the sinker region 313. In FIG. 11A, the sinker region 313 is disposed within the body region 311 without contacting the edge of the body region 311. This structural design or profile may be achieved, for example, by properly setting parameters such as energy of ions 460A for implantation, thickness of the first portion 352 of the patterned second hard mask 351A, or both. Other elements shown in the FIG. 11A are a substrate 300, a first epitaxial layer 301, a second epitaxial layer 310, a patterned first hard mask 350, and the second portion 353 of the patterned second hard mask 351A.

Figure 11B:
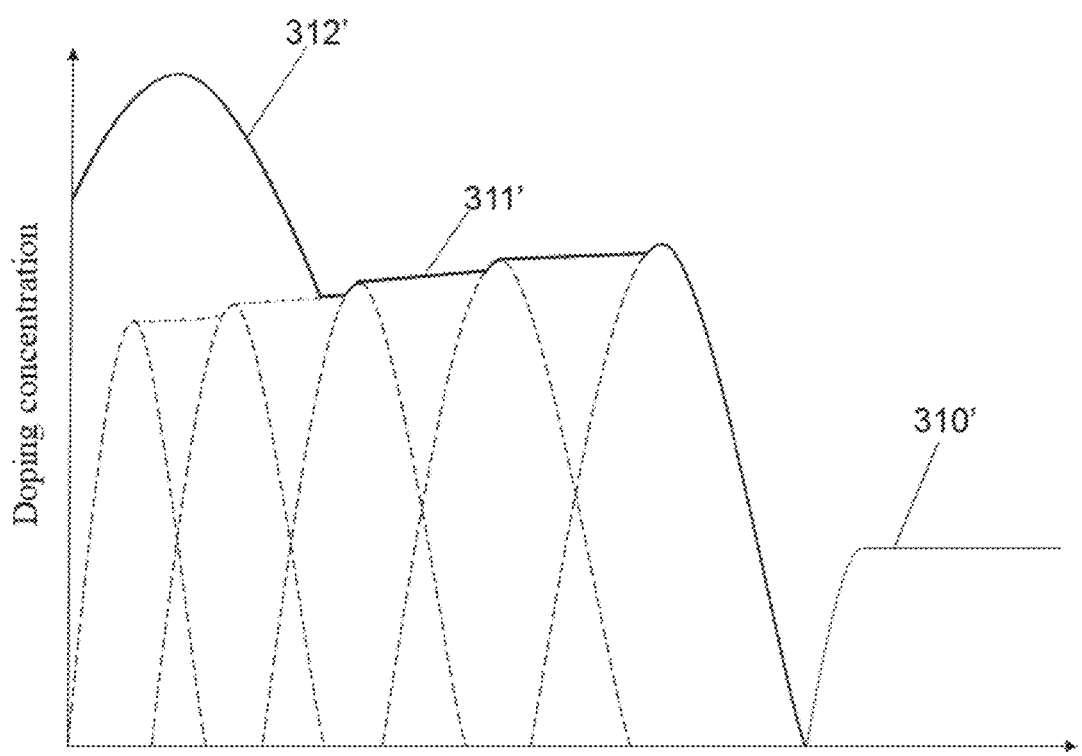
FIG. 11B illustrates doping profiles of contact region, body region, and second epitaxial layer of FIG. 11A in accordance with an embodiment.
Figure 11C:
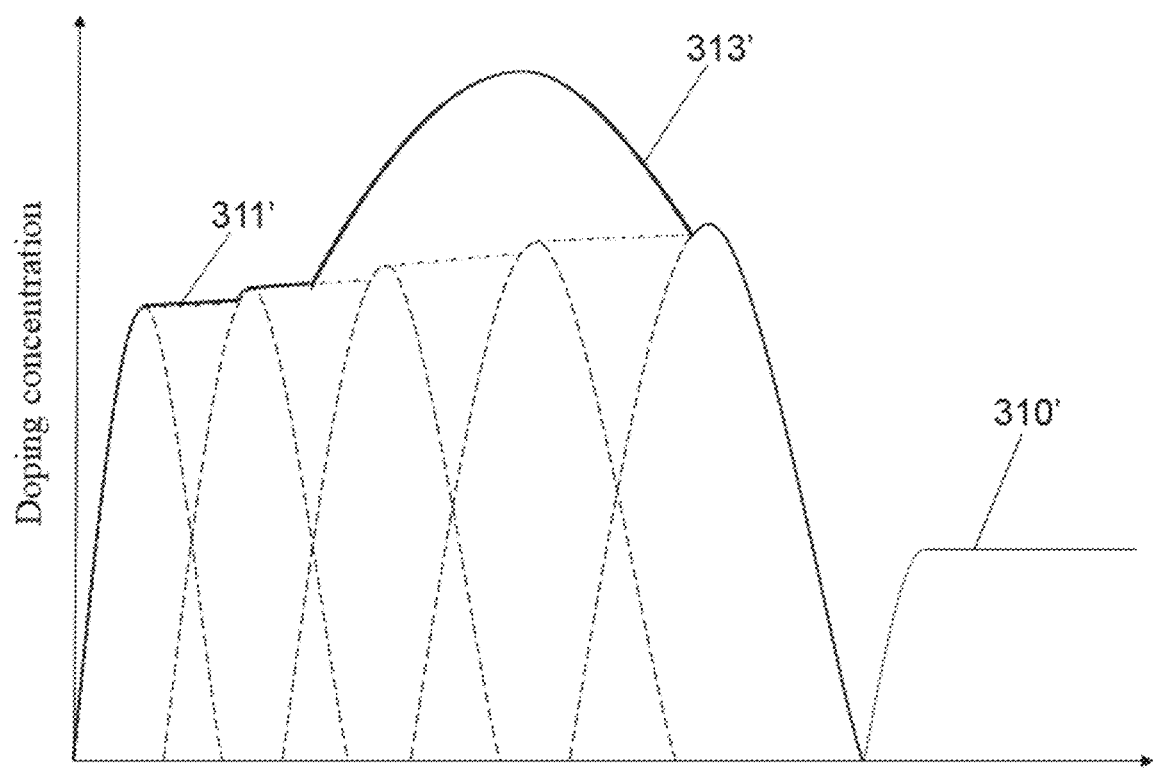
FIG. 11C illustrates doping profiles of body region, sinker region, and second epitaxial layer of FIG. 11A in accordance with an embodiment.

Exemplary doping profiles 311', 312', 313', and 310' of the body region 311, the contact region 312, the sinker region 313, and the second epitaxial layer 310 respectively are illustrated in FIGS. 11B and 11C.

In one or more embodiments as described herein, the first conductivity type is n-type, and the second conductivity type is p-type. It would be appreciated by a person having ordinary skill in the art that in some embodiments, the first conductivity type may be p-type, and the second conductivity type may be n-type.

In one or more embodiments as described herein, aluminum ions are used for p-type doing for body regions, contact regions, and sinker regions, while nitrogen ions are used for n-type doing for source regions. It would be appreciated that other types of ions may be used. For example, other acceptor impurities, such as boron, may be used for p-type doing. Other donor impurities, such as phosphorus and arsenic, may be used for n-type doing.

In one or more embodiments as described herein, a semiconductor layer includes three layers, i.e., a substrate, a first epitaxial layer, and a second epitaxial. It would be appreciated that in some embodiments, a semiconductor layer may include less than three layers (e.g., only a substrate, or a substrate and a drift layer disposed onto the substrate), or more than three layers.

In one or more embodiments as described herein, the semiconductor layer includes silicon carbide, or is formed of silicon carbide. It would be appreciated that in some other embodiments, the semiconductor layer may include or be formed of other semiconductor materials, such as silicon, germanium, gallium nitride, indium phosphide, etc.

In one or more embodiments as described herein, numeral values are provided as a range. It would be appreciated that the range shall mean a closed interval that includes both end points. For example, the statement "[t]he first hard mask 240 may have a thickness from 3 μm to 6 μm" shall mean the thickness of the first hard mask 240 can be 3 μm, 6 μm, or other values between 3 μm and 6 μm.

The parameters, such as numerical values of thickness, length, doping concentrations, etc. are illustrative. These parameters may be adjusted according to practical needs, such as voltage rating.

The drawings are illustrative, and should not be interpreted as presenting the actual size, dimensions, actual scales of actual devices, elements, regions, layers, etc.

Further, a figure as referenced herein does not necessarily correspond to one manufacturing process or step. Rather, as manufacturing of a semiconductor device generally includes multiple or many steps, for concise without sacrificing clarify, a figure may correspond to two or more steps. For example, FIG. 4B corresponds to photolithographic process (coating of photoresist, etc.), patterning the second hard mask, photoresist removal, etc.

Also, in a figure as referenced herein, no all elements are necessarily assigned with reference numerals. For example, in FIG. 1A, for clarify and concise purpose only, not all body region is identified with the reference numeral 111. Not all contact region is identified with the reference numeral 112. Not all sinker region is identified with the reference numeral 113. Not all source region is identified with the reference numeral 114. And so on.

It would further be appreciated that the term "layer" as used herein does not necessarily mean a continuous film. Rather, due to the process such as patterning, a layer may have break or discontinuity. For example, the patterned doped polysilicon layer 121 may include multiple separate doped polysilicon. Also, the term "layer" does not necessarily mean that the layer has to be flat or be on a flat surface. For example, the barrier metal layer 130 is an example that the layer is not on a flat surface.

One or more embodiments as described herein are not isolated. Some of them may be properly combined in one way or another to arrive at one or more variations and/or modifications, which are also covered by the inventive concept as described herein.

What is claimed:

1. A method of making a semiconductor device, comprising:
   providing a semiconductor layer of a first conductivity type;
   providing a first hard mask on a surface of the semiconductor layer;
   patterning the first hard mask to obtain a patterned first hard mask such that a portion of the surface is exposed to obtain an exposed surface of the semiconductor layer;
   forming a body region in the semiconductor layer by using the patterned first hard mask as mask, the body region being of a second conductivity type different from the first conductivity type;
   providing a second hard mask on the patterned first hard mask and the exposed surface of the semiconductor layer;
   patterning the second hard mask to obtain a patterned second hard mask; and
   forming a contact region and a sinker region by using the patterned first hard mask and the patterned second hard mask as mask, the contact region and the sinker region being of the second conductivity type.

2. The method of claim 1, wherein providing the first hard mask comprises depositing plasma-enhanced tetraethylorthosilicate on the surface of the semiconductor layer, and wherein providing the second hard mask comprises depositing a conformal dielectric film on the patterned first hard mask and the exposed surface.

3. The method of claim 1, wherein forming the contact region and the sinker region comprises conducting ion implantation by using the patterned first hard mask and the patterned second hard mask as mask.

4. The method of claim 3, further comprising:
   adjusting relative position between the contact region and the sinker region by adjusting energy of the ion implantation, or thickness of the second hard mask, or both; and
   adjusting junction depth of the contact region and the sinker region by adjusting energy of the ion implantation, or thickness of the second hard mask, or both.

5. The method of claim 1, further comprising:
   forming a source region of the first conductivity type by using the patterned first hard mask and the patterned second hard mask as mask.

6. A method of making a semiconductor device, comprising:
   providing a substrate of a first conductivity type;
   providing a first epitaxial layer of the first conductivity type on the substrate, the first epitaxial layer having lower doping concentration than doping concentration of the substrate;
   providing a second epitaxial layer of the first conductivity type on the first epitaxial layer, the second epitaxial layer having lower doping concentration than the doping concentration of the first epitaxial layer;
   forming a first oxide layer on the second epitaxial layer as a first hard mask;
   patterning the first hard mask to obtain a patterned first hard mask;
   forming a body region of a second conductivity type by conducting a first ion implantation using the patterned first hard mask as mask, the body region extending from a surface of the second epitaxial layer towards the first epitaxial layer;
   forming a second oxide layer on the patterned first hard mask and a surface of the body region;
   patterning the second hard mask to obtain a patterned second hard mask; and
   forming a contact region and a sinker region by conducting a second ion implantation using the patterned first hard mask and the patterned second hard mask as mask, the contact region and the sinker region being of the second conductivity type and having a higher doping concentration than a doping concentration of the body region.

7. The method of claim 6, further comprising:
   adjusting energy of the second ion implantation such that the contact region and the sinker region are physically disconnected.

8. The method of claim 6, further comprising:
adjusting thickness of the second hard mask such that the contact region and the sinker region are physically disconnected.

9. The method of claim 6, wherein forming the first oxide layer comprises depositing plasma-enhanced tetraethylorthosilicate on the second epitaxial layer.

10. The method of claim 6, wherein conducting the first ion implantation comprises conducting three to six ion implantation steps with energy ranging from 50 keV to 950 keV at a temperature ranging from 400° C. to 600° C.

11. The method of claim 6, wherein forming the second oxide layer comprises depositing a conformal dielectric film on the patterned first hard mask and the surface of the body region, the conformal dielectric film having a thickness ranging from 0.6 micrometer (µm) to 1.2 µm.

12. The method of claim 11, wherein the conformal dielectric film comprises at least one of silane-based oxide and tetraethylorthosilicate-based oxide.

13. The method of claim 6, wherein the second hard mask covers sidewall of the patterned first hard mask and has a sidewall thickness, and wherein patterning the second hard mask comprises adjusting a channel length of the semiconductor device by adjusting the sidewall thickness of the second hard mask.

14. A method of making a semiconductor device, comprising:
providing a semiconductor layer of a first conductivity type including a substrate;
forming a body region in the semiconductor layer and extending from a surface of the semiconductor layer towards the substrate, the body region being of a second conductivity type different from the first conductivity type;
forming a contact region of the second conductivity type in the body region and extending from the surface of the semiconductor layer towards the substrate;
forming at least one sinker region of the second conductivity type embedded in the semiconductor layer, the contact region and the at least one sinker region being formed by ion implantation with a same mask and having higher doping concentration than doping concentration of the body region, wherein the at least one sinker region is physically separated from the contact region; and
forming two source regions of the first conductivity type extending from the surface of the semiconductor layer towards the substrate and disposed in the body region such that the contact region is placed between the two source regions and contacts the two source regions.

15. The method of claim 14, wherein the semiconductor layer comprises a first epitaxial layer disposed on the substrate and a second epitaxial layer disposed on the first epitaxial layer, and wherein the body region is disposed in the second epitaxial layer.

* * * * *